United States Patent
Tani et al.

[11] Patent Number: 6,086,793
[45] Date of Patent: Jul. 11, 2000

[54] METHOD OF PRODUCING ELECTRICALLY CONDUCTIVE PASTES AND MATERIALS USING SAME

[75] Inventors: Hiroji Tani; Kazuhito Oshita, both of Kyoto, Japan

[73] Assignee: Murata Manufacturing Co., Ltd., Kyoto, Japan

[21] Appl. No.: 09/377,476

[22] Filed: Aug. 19, 1999

Related U.S. Application Data

[63] Continuation-in-part of application No. 09/134,590, Aug. 13, 1998, abandoned, and a division of application No. 08/841,474, Apr. 22, 1997, abandoned, and a continuation of application No. 08/566,045, Dec. 1, 1995, abandoned.

[30] Foreign Application Priority Data

Dec. 2, 1994 [JP] Japan ................................ 6-299757

[51] Int. Cl.[7] ............................................. H01B 1/22
[52] U.S. Cl. ............................ 252/512; 252/514; 75/255; 427/97
[58] Field of Search ............................. 252/512, 513, 252/514; 106/1.13, 1.18; 75/255, 314; 427/96, 97, 123, 372.2

[56] References Cited

U.S. PATENT DOCUMENTS

| 4,695,403 | 9/1987 | Nishimura et al. .................. 252/513 |
| 5,336,444 | 8/1994 | Casey et al. ......................... 252/513 |

*Primary Examiner*—Mark Kopec
*Attorney, Agent, or Firm*—Majestic, Parsons, Siebert & Hsue P.C.

[57] ABSTRACT

An electrically conductive paste for use as a conductive material in multi-layered ceramic substrate is formed with an organic vehicle and electrically conductive Cu particles mixed with particles of a refractory metal such as Ni, Pd, W and Mo having a higher melting point than Cu. An electrically conductive film material can be obtained by subjecting such a paste to a firing process in a non-oxidizing atmosphere such as a $N_2$ atmosphere.

5 Claims, 1 Drawing Sheet

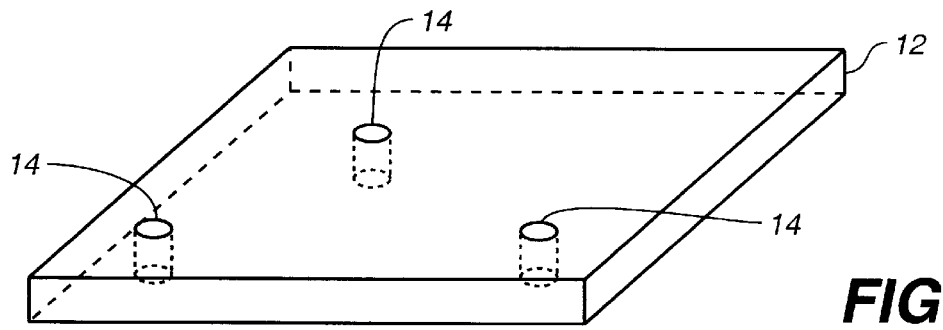
FIG._1A
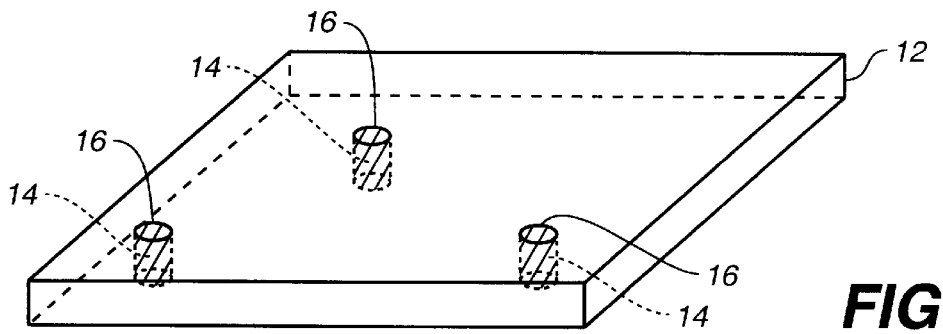
FIG._1B
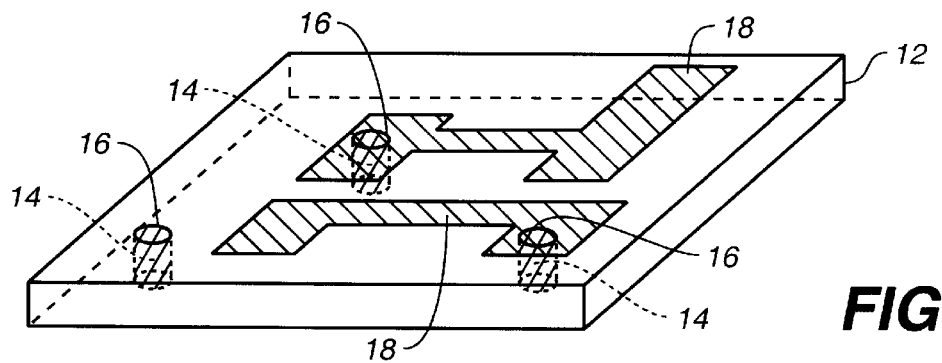
FIG._1C
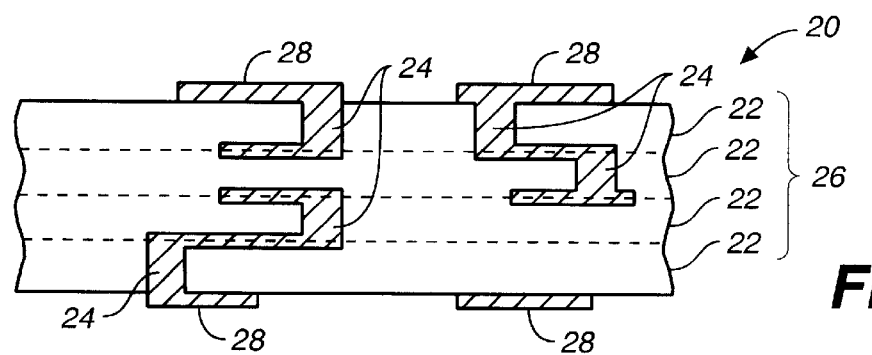
FIG._2

METHOD OF PRODUCING ELECTRICALLY CONDUCTIVE PASTES AND MATERIALS USING SAME

This is a continuation-in-part of application Ser. No. 09/134,590, filed Aug. 13, 1998, now abn which is a divisional of application Ser. No. 08/841,474, filed Apr. 22, 1997, which is now abandoned and is a continuation of application Ser. No. 08/566,045, filed Dec. 1, 1995, now abandoned.

BACKGROUND OF THE INVENTION

This invention relates to a method of producing electrically conductive pastes (herein referred to simply as "conductive pastes") which can be useful as a conductive material for the production of multi-layered ceramic substrates, as well as conductive materials themselves produced by using such a paste.

Ceramic substrates are being used commonly for mounting many kinds of electronic components to form an electronic circuit in order to produce compact electronic devices and instruments. In order to further increase the mounting density, it is becoming a common practice to stack a plurality of ceramic green sheets with circuit patterns formed on their surfaces by using a paste containing a conductive substance and to form an integral multi-layered structure by a firing process. In order to make electrical connections between such ceramic sheets, viaholes are initially formed through the ceramic green sheets by using a drill or a puncher and are filled with a conductive paste. Circuits are formed on the surfaces of the green sheets, for example, by a screen-printing process by using such a conductive paste. After the green sheets are thus prepared, they are stacked one on top of another, compressed, cut to an appropriate size and then subjected to a firing process. The conductive paste, both inside the viaholes and on the green sheets, is sintered at the same time such that the circuits inside the multi-layered ceramic substrate become connected.

As electrically conductive particles which are mixed in to form such pastes, use is frequently made of Cu because it has low specific resistance, because migration does not occur easily and also because it is inexpensive. Pastes, which are made by mixing and dispersing Cu particles in an organic vehicle having a resin component, say, of ethyl cellulose resin, are now in use.

In summary, prior art multi-layered ceramic substrates are produced by subjecting ceramic green sheets and a Cu paste to a firing process simultaneously. In the firing process, however, the ceramic green sheets and the Cu paste shrink differently in that the shrinkage of Cu due to the sintering takes place before that of the ceramic and at a lower temperature. As a result, delamination may take place between the multi-layered ceramics and the conductive material between the layered ceramics or cracks may appear after the sintering, thereby affecting the reliability of the multi-layered ceramic substrates adversely.

SUMMARY OF THE INVENTION

It is therefore an object of this invention to provide a method of producing an electrically conductive paste which is capable, when used as a conductive material in the production of a multi-layered ceramic substrate, of preventing the occurrence of delamination and cracks.

It is another object of this invention to provide a method of producing electrically conductive materials formed by using such a paste.

Conductive pastes according to this invention, with which the above and other objects can be accomplished, may be characterized as comprising an organic vehicle and electrically conductive particles which are mostly Cu but also include particles of a refractory metal (within the meaning commonly understood and defined, for example, in McGraw-Hill Dictionary of Scientific and Technical Terms) with a higher melting point such as Ni, Pd, W and Mo, mixed at a ratio within a specified range. Particles with average diameter within a specified range are preferred. Conductive materials according to this invention are characterized as being formed by subjecting such a particle mixture to a firing process.

A method of this invention for producing such an electrically conductive paste may be characterized as comprising the steps of preparing Cu particles and refractory metal particles (as defined above) with melting point higher than Cu, the refractory metal particles comprising at least one selected from the group consisting of Pd particles and Ni particles, and making a mixture free of oxides and containing the Cu particles by 99.5 weight % or less and the refractory metal particles by 0.5 weight % or more to thereby produce an electrically conductive paste. A method of this invention for obtaining an electrically conductive material free of oxides may be characterized as comprising the step of firing a mixture as described above only in a $N_2$ atmosphere to thereby obtain an electrically conductive material free of oxides.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1A, 1B and 1C are schematic drawings for showing a ceramic sheet at various stages in the production of a multi-layered ceramic substrate embodying this invention; and FIG. 2 is a sectional view of a portion of a multi-layered ceramic substrate according to this invention.

DETAILED DESCRIPTION OF THE INVENTION

Electrically conductive pastes according to this invention are characterized as comprising an organic vehicle and electrically conductive particle dispersed therein, the conductive particles including Cu particles by 90–99.5 weight % and Ni particles by 0.5–10 weight % according to a first embodiment, Cu particles by 95–99.5 weight % and Pd particles by 0.5–5 weight % according to a second embodiment, Cu particles by 80–99.5 weight % and W particles by 0.5–20 weight % according to a third embodiment, and Cu particles by 80–99.5 weight % and Mo particles by 0.5–20 weight % according to a fourth embodiment. The average diameter of each kind of conductive particles is preferably 0.5–5μm.

Electrically conductive materials according to this invention may be characterized as being formed (say, as a film) by subjecting to a firing process a mixture including Cu particles by 90–99.5 weight % and Ni particles by 0.5–10 weight % according to a first embodiment, Cu particles by 95–99.5 weight % and Pd particles by 0.5–5 weight % according to a second embodiment, Cu particles by 80–99.5 weight % and W particles by 0.5–20 weight % according to a third embodiment, and Cu particles by 80–99.5 weight % and Mo particles by 0.5–20 weight % according to a fourth embodiment.

Multi-layered ceramic substrates according to this invention may be characterized as comprising a plurality of ceramic sheets stacked one on top of another and electrically conductive material serving as circuits formed therebetween by subjecting to a firing process a mixture which includes Cu particles by 90–99.5 weight % and Ni particles by 0.5–10 weight % according to a first embodiment, Cu particles by 95–99.5 weight % and Pd particles by 0.5–5 weight % according to a second embodiment, Cu particles by 80–99.5 weight % and W particles by 0.5–20 weight % according to a third embodiment, and Cu particles by 80–99.5 weight % and Mo particles by 0.5–20 weight % according to a fourth embodiment.

If a conductive paste of this invention is subjected to a firing process, the sintering of the Cu particles is inhibited by the presence of Ni, Pd, W or Mo which are a refractory metal with a higher melting point. Thus, the temperature at which the shrinking of Cu begins to take place during the firing process becomes higher. In other words, the manner in which Cu shrinks during the firing process becomes similar to that of the ceramic green sheets. If the diameter of the conductive particles are such as to satisfy the conditions of this invention, furthermore, conductive pastes optimally suited for screen printing can be obtained.

Next, the invention is described more in detail by way of examples.

As a ceramic material, a composite $BaO—Al_2O_3—SiO_2$ based glass material was prepared. An organic binder such as polyvinyl butyral and an organic solvent such as toluene were mixed to particles of this glass material to obtain a slurry. The slurry thus obtained was made into the form of a sheet by means of a doctor blade to produce ceramic green sheets shown at 12 in FIG. 1A. Viaholes 14 were formed through these ceramic green sheets 12 by means of a puncher.

To produce conductive pastes embodying this invention, on the other hand, Cu particles with average diameter of 0.5 μm, 1 μm, 3 μm and 5μm, and Ni, Pd, W and Mo particles with average diameter of 0.5 μm, 1 μm and 5 μm were prepared. An organic vehicle comprised of an organic binder containing ethyl cellulose resin and alkyd resin and a solvent such as terpineol was added to different mixtures of these conductive particles, and conductive pastes shown in Table 1 were produced by using a three-roll mill to mix them together. These mixtures contained 10–100 weight parts of the organic vehicle against 100 weight parts of the conductive particles.

Next, the viaholes 14 in the ceramic green sheets 12 (only one of the sheets being shown in FIG. 1B) were filled with one of these conductive pastes (indicated by numerals 16). After it was dried, the same paste was used to form circuit patterns 18 on the ceramic green sheets 12, as shown in FIG. 1C (only one of the sheets being shown), by screen printing. A plurality of these ceramic green sheets 12 were stacked one on top of another, compressed together and cut to a specified size. They were thereafter subjected to a firing process at 900–1000° C. for 1–2 hours within a $N_2$ atmosphere to obtain a multi-layered ceramic substrate having a conductive material inside the viaholes and between the layered ceramic sheets. It is to be noted that the firing process according to this invention is effected always in a non-oxidizing atmosphere such that the final product will not include any oxides.

FIG. 2 is a sectional view of a portion of a multi-layered ceramic substrate 20 thus produced, embodying the invention and comprising a plurality of ceramic sheets 22 obtained by subjecting the green sheets 12 (shown in FIG. 1C) to a firing process. These ceramic sheets 22 are fused together by the firing process and now form an integral layered structure 26. Each ceramic sheet 22 is provided with viaholes 24 filled with a conductive material 28 obtained by firing the conductive paste 16 (as shown in FIGS. 1B and 1C). The conductive material 28 is also formed as circuit patterns on the outer surfaces of the layered structure 26 as well as between the ceramic sheets 22.

Sectional surfaces of the multi-layered ceramic substrates thus obtained were examined by using an optical microscope to investigate the presence or absence of delamination in the conductive material between the layered sheets and cracks in the viahole portions. The results of this investigation are also shown in Table 1. In Table 1, symbols "*" indicate samples which are not according to this invention. Symbols "**" indicate occurrence of cracks in the ceramic due to the expansion of the conductive material inside a viahole.

TABLE 1

| No. | Cu particles (Average diameter (μm))/ (weight %) | Added particles | | Observation | |
|---|---|---|---|---|---|
| | | Metal | (Average diameter (μm))/ (weight %) | Cracks (Viahole) | Delamination (Conductor between layers) |
| 1* | 1/100 | — | — | Yes | Yes |
| 2* | 3/100 | — | — | Yes | Some |
| 3* | 5/100 | — | — | Some | Some |
| 4 | 0.5/90 | Ni | 0.5/10 | No | No |
| 5 | 1/95 | Ni | 1/5 | No | No |
| 6 | 3/97.5 | Ni | 1/2.5 | No | No |
| 7 | 5/99.5 | Ni | 5/0.5 | No | No |
| 8* | 1/80 | Ni | 1/20 | ** | No |
| 9 | 3/95 | Pd | 1/5 | No | No |
| 10 | 5/99.5 | Pd | 0.5/0.5 | No | No |
| 11* | 3/90 | Pd | 1/10 | ** | No |
| 12 | 1/80 | W | 0.5/20 | No | No |
| 13 | 3/90 | W | 1/10 | No | No |
| 14 | 5/99.5 | W | 5/0.5 | No | No |
| 15* | 1/70 | W | 0.5/30 | ** | No |
| 16 | 3/90 | Mo | 1/10 | No | No |
| 17 | 1/80 | Mo | 0.5/20 | No | No |
| 18 | 5/99.5 | Mo | 5/0.5 | No | No |
| 19* | 1/70 | Mo | 0.5/30 | ** | No |

Samples Nos. 4–7 of Table 1 clearly show that multi-layered ceramic substrates without delaminations in the conductive material between the layered ceramic sheets or cracks in the viahole portions can be obtained by using as its conductive material a conductive paste containing Cu particles by 90–99.5 weight % and Ni particles by 0.5–10 weight %. If the ratio of Cu particles is less than 90 weight % and that of Ni particles exceeds 10 weight %, as is the case with Sample No. 8, cracks are generated in the ceramic sheets due to the expansion of the conductor inside a viahole. Samples Nos. 9 and 10 show that multi-layered ceramic substrates without delaminations in the conductive material between the layered ceramic sheets or cracks in the viahole portions can be obtained by using as its conductive material a conductive paste containing Cu particles by 95–99.5 weight % and Pd particles by 0.5–5 weight %. If the ratio of Cu particles is less than 95 weight % and that of Pd particles exceeds 5 weight %, as is the case with Sample No. 11, cracks are generated in the ceramic sheets due to the expansion of the conductor inside a viahole. Samples Nos. 12–14 show that multi-layered ceramic substrates without delaminations in the conductive materials between the layered ceramic sheets or cracks in the viahole portions can be obtained by using as its conductive material a conductive paste containing Cu particles by 80–99.5 weight % and W particles by 0.5–20 weight %. If the ratio of Cu particles is less than 80 weight % and that of W particles exceeds 20 weight %, as is the case with Sample No. 15, cracks are generated in the ceramic sheets due to the expansion of the conductor inside a viahole. Samples Nos. 16–18 show that multi-layered ceramic substrates without delaminations in the conductive materials between the layered sheets or cracks in the viahole portions can be obtained by using as its conductive material a conductive paste containing Cu particles by 80–99.5 weight % and Mo particles by 0.5–20 weight %. If the ratio of Cu particles is less than 80 weight % and that of Mo particles exceeds 20 weight %, as is the case with Sample No. 19, cracks are generated in the layered ceramic sheets due to the expansion of the conductor inside a viahole. If the ratio of Cu particles exceeds 99.5% and that of Ni, Pd, W or Mo particles is less than 0.5 weight %, on the other hand, there is hardly any effect of inhibiting sintering and thereby shifting the temperature at which the shrinking of Cu particles due to firing in the direction of higher temperatures due to the addition of these metals having a high melting point.

Conductive pastes optimally suited for screen printing can be obtained if the average diameter of the Cu particles contained therein is 0.5–30μm. If the average diameter of the conductive particles is less than 0.5 μm, thixotropicity of the conductive paste is increased. This has the effect of lowering its fluidity, and the viaholes cannot be filled effectively with the paste. If the average diameter of the conductive particles exceeds 5 μm, on the other hand, microscopic dispersion of the conductive material becomes poor and the reaction becomes uneven at the time of sintering.

Although only an organic vehicle comprising an organic binder with ethyl cellulose resin and alkyd resin and a terpineol solvent was used in the examples described above, this is not intended to limit the scope of the invention. A choice may be made otherwise from organic vehicles commonly used for thick-film pastes, depending on the combination of ceramic green sheets and the binder.

Specifically, a paste comprising ethyl cellulose resin and a terpineol solvent, a paste comprising acrylic resin and a terpineol solvent and a paste comprising butyral resin and an alcohol solvent can be used.

In addition, an electrically conductive paste of the present invention can be sintered by itself at a temperature in the range of about 500 to 1050° C. in order to form an electrically conductive material. Therefore, in the case where ceramic green sheets made of a ceramic material other than the material explained above is used, a multi-layered ceramic substrate can be prepared according to this invention by sintering the green sheets and the electrically conductive paste therebetween at a temperature in the range of about 830 to 1050° C.

Although not discussed in the examples described above, known kinds of glass frit such as containing lead borosilicate and zinc borosilicate may be added in order to improve adhesion between the conductive material and ceramics.

In summary, conductive pastes containing conductive particles according to this invention may be regarded as a Cu paste additionally containing particles of Ni, Pd, W or Mo which are metals with a higher melting point such that the temperature at which the sintering of Cu starts is shifted in the direction of higher temperatures, and the manner in which Cu shrinks at the time of firing becomes similar to that of ceramic green sheets. This has the effect of preventing the generation of cracks and delaminations caused by the difference in the rate of shrinking at the time of sintering. If the diameters of the conductive particles are within a specified range according to this invention, furthermore, it is possible to obtain conductive pastes which are optimally suited for screen printing. With a conductive material obtained by a firing process on a conductive paste of this invention, it is possible to obtain multi-layered ceramic substrates with no cracks in the viahole portions and no delaminations in the conductive material between the ceramic layers. Since individual metal particles and an organic vehicle are mixed together according to this invention, and since no alloy particles are required, conductive pastes of this invention can be obtained more easily and more inexpensively.

What is claimed is:

1. A method of obtaining an electrically conductive material free of oxides, said method comprising the steps of:
   preparing Cu particles and refractory metal particles with melting point higher than Cu, said refractory metal particles comprising at least one selected from the group consisting of Pd particles and Ni particles;
   making a mixture free of oxides and containing said Cu particles by 99.5 weight % or less and said refractory metal particles by 0.5 weight % or more; and
   firing said mixture only in a $N_2$ atmosphere to thereby obtain an electrically conductive material free of oxides.

2. The method of claim 1 wherein said mixture contains said Cu particles by 90–99.5 weight % and said refractory metal particles by 0.5–10 weight %.

3. The method of claim 2 wherein the average diameters of said Cu particles and said refractory metal particles are each 0.5–5 μm.

4. The method of claim 1 further comprising the step of filling said mixture in a ceramic green sheet and wherein said mixture is fired together with said green sheet in said $N_2$ atmosphere.

5. The method of claim 1 further comprising the step of filling said mixture in a viahole formed in a ceramic green sheet and wherein said mixture is fired together with said green sheet in said $N_2$ atmosphere.

* * * * *